(12) United States Patent
Tang-Kong

(10) Patent No.: US 10,390,461 B2
(45) Date of Patent: Aug. 20, 2019

(54) HEAT SINK FOR HEAD UP DISPLAY

(71) Applicant: Panasonic Automotive Systems Company of America, Division of Panasonic Corporation of North America, Peachtree City, GA (US)

(72) Inventor: Gerald Anthony Tang-Kong, Newnan, GA (US)

(73) Assignee: Panasonic Automotive Systems Company of America, Division of Panasonic Corporation of North America, Peachtree City, GA (US)

( * ) Notice: Subject to any disclaimer, the term of this patent is extended or adjusted under 35 U.S.C. 154(b) by 0 days.

(21) Appl. No.: 15/701,712

(22) Filed: Sep. 12, 2017

(65) Prior Publication Data

US 2018/0077817 A1 Mar. 15, 2018

Related U.S. Application Data

(60) Provisional application No. 62/393,228, filed on Sep. 12, 2016.

(51) Int. Cl.
| | |
|---|---|
| *F28F 7/00* | (2006.01) |
| *F28F 13/00* | (2006.01) |
| *H05K 7/20* | (2006.01) |
| *H01L 23/367* | (2006.01) |

(52) U.S. Cl.
CPC ......... *H05K 7/2039* (2013.01); *H01L 23/367* (2013.01)

(58) Field of Classification Search
CPC ................ H01L 23/467; F28F 2215/04; F28D 2021/0029

USPC ........................................................ 165/80.3
See application file for complete search history.

(56) References Cited

U.S. PATENT DOCUMENTS

| | | | | |
|---|---|---|---|---|
| 6,295,202 B1* | 9/2001 | Tucker | ...................... | G06F 1/20 165/185 |
| 6,308,771 B1* | 10/2001 | Tavassoli | .................. | F28F 3/02 165/80.3 |
| 7,274,571 B2* | 9/2007 | Wei | ...................... | H05K 7/1461 165/104.26 |
| 2003/0131973 A1* | 7/2003 | Nair | ......................... | F28F 3/04 165/104.33 |
| 2004/0182542 A1* | 9/2004 | Take | .................... | H01L 23/3672 165/80.3 |
| 2004/0190257 A1* | 9/2004 | Chang | ................. | H01L 23/3677 361/703 |
| 2006/0042787 A1* | 3/2006 | Yu | ....................... | H01L 23/4093 165/185 |
| 2008/0011451 A1* | 1/2008 | Wang | .................... | H01L 23/367 165/80.3 |
| 2014/0332182 A1* | 11/2014 | Taras | ..................... | H01L 23/36 165/80.3 |
| 2016/0106000 A1* | 4/2016 | Tang-Kong | ............. | F28F 3/048 165/80.3 |

(Continued)

*Primary Examiner* — Jason N Thompson
(74) *Attorney, Agent, or Firm* — Laurence S. Roach, Esq.

(57) ABSTRACT

A heat sink is for a heat source including an electronic component. The heat sink includes a base having a first surface and an opposite second surface. The first surface has a middle portion engaging the heat source. A plurality of elongate fins project from the second surface of the base and extend in directions perpendicular to the second surface. Middle ones of the fins are disposed opposite the middle portion of the first surface and have a greater height than other ones of the fins.

18 Claims, 3 Drawing Sheets

(56) References Cited

U.S. PATENT DOCUMENTS

2017/0055366 A1\* 2/2017 Backhaus ................ H01G 4/38

\* cited by examiner

HEAT SINK FOR HEAD UP DISPLAY

CROSS-REFERENCED TO RELATED APPLICATIONS

This application claims benefit of U.S. Provisional Application No. 62/393,228 filed on Sep. 12, 2016, which the disclosure of which is hereby incorporated by reference in its entirety for all purposes.

BACKGROUND OF THE INVENTION

1. Field of the Invention

The present invention relates to a heat sink, and, more particularly, to a heat sink for dissipating heat from a head up display in a motor vehicle.

2. Description of the Related Art

Heat sinks are known to physically engage and carry heat away from electronic components that otherwise may be damaged by the heat. The heat sink typically is made of aluminum and has a base with a surface that contacts the electronic component. The heat sink also typically has a series of fins extending from the base in a direction away from the electronic component. The fins provide a large surface area within a limited three-dimensional space to thereby increase the rate of convection of heat from the heat sink to the air.

SUMMARY OF THE INVENTION

The invention may provide a heat sink for use under natural convection conditions and with surface mount devices. The heat sink may be formed of aluminum and include features that increase thermal dissipation characteristics. The outer side of the base of the heat sink has a convex shape, and the base is thicker at the middle of the base than at the ends of the base. Thus, the heat sink has a higher capacity to carry away heat from the middle of the printed circuit board, where the board is hottest. The fins may fan out away from the base of the heat sink due to the convex external surface of the base. That is, the distance between adjacent fins increases along the heights of the fins. The increased distance between adjacent fins may enable the fins to have greater thicknesses. Thus, the heat sink may have higher heat capacity as compared to the equivalent envelope of a traditional heat sink.

The heat sink may include fins in the middle of the heat sink of greater thickness than the fins on the ends of the heat sink. The thickness of the fins in the middle of the heat sink, and possibly of the fins on the ends of the heat sink as well, may be tapered such that the fins become progressively thinner towards the distal ends thereof.

The invention may provide an extruded heat sink which occupies relatively little space and has relatively short fins, but still has excellent heat dissipation. The heat sink may possibly be applied to a head up display (HUD) in which there are severe space constraints behind the instrument cluster, and thus limitations on the heights of the heat sink fins. The heat source may be positioned along the middle of the heat sink, but alternate locations are possible.

The base of the heat sink has a non-uniform cross section. The thickest section is located directly above the thermal source and the thickness tapers off as the distance from the heat source increases. The heat sink can have a flat surface where the heat source is attached and an arcuate or annular surface profile where the fins are attached. These surface shapes may promote more even heat spreading from the heat source through the heat sink base. An arcuate or circular surface profile for fin mounting is described in U.S. patent application Ser. No. 14/881,338, filed Oct. 13, 2015.

There may be variation in the height of the fins of the heat sink. The fin height at the center of the heat sink, where the heat source is located, may be higher than at the other fins in order to promote heat dissipation at the heat source location. The fins may be progressively shorter as the distance from the heat source increases. The fins may be the shortest at the edges of the heat sink where heat dissipation requirements are lower due to the greater distance from the heat source in order to promote heat dissipation at the heat source location.

There may be variation in the gaps between the heat sink fins. The heat sink fin gaps may be largest above the heat source location and may become progressively smaller as the distance from the heat source increases. The heat sink fin gaps may be smallest at the end of the heat sink. The larger fin gaps above the heat source may enable increased air flow between the fins, increasing convective heat transfer, and thus increasing heat dissipation from the heat sink above the heat source. At the edge of the heat sink, there is a decreased need for heat dissipation, so the fin spacing may be smaller.

The fins of the heat sink may be tapered. The heat sink fins may be thicker at the root or base of the fins. The thicker the fin root, the greater the heat conduction from the heat sink base. A thick fin root with a lot of material also promotes thermal dissipation from the base through the fins.

There may be variation between fins in how much taper, or change in thickness, there is along the heights of the fins. The taper of the fins above the heat source may be greater than of the fins that are farther away from the heat source. For example, the fins above the heat source may have greater thickness at their base than do the fins that are not above the heat source, although their thicknesses may be approximately equal at their tips or distal ends. Thus, the fins above the heat source may have more material, resulting in increased thermal conductivity, increased local heat conduction, and better overall heat dissipation.

There may be a chamfer at the interface or junction between the heat sink fin and the base. Typically, according to the prior art, the interface between the fin and the base is a sharp corner or has a very small radius. This prior art interface results in a zero-velocity region where there is no convective heat transfer. Adding the chamfer, according to the invention, eliminates the corner, locally raising the surface to promote some air flow and convective heat transfer. Adding the chamfer also adds some material, resulting in increased thermal conduction.

The gap between two adjacent fins may increase from the fin root to the tip. The larger gap between the fins at the tips enable higher air velocities and increased air flow volume, thus increasing convective heat transfer.

The heat sink may have mounting flanges for attaching to a printed circuit board (PCB) with heat source(s), and for attachment of the heat sink to a housing. The heat source can be any electronic device such an integrated circuit (IC), an HB brand light emitting diode (LED), a laser, etc.

The heat sink finish can be fabricated or anodized black for increased heat dissipation. The width and length of the heat sink can be varied to improve thermal performance and meet packaging requirements. For example, the heat sink can be made longer to accommodate a longer PCB with more components.

The invention comprises, in one form thereof, a heat sink for a heat source. The heat source includes an electronic component. The heat sink includes a base having a first surface and an opposite second surface. The first surface has a middle portion engaging the heat source. A plurality of elongate fins project from the second surface of the base and extend in directions perpendicular to the second surface. Middle ones of the fins are disposed opposite the middle portion of the first surface and have a greater height than other ones of the fins.

The invention comprises, in another form thereof, a heat sink for a heat source. The heat source includes an electronic component. The heat sink includes a base having a first surface and an opposite second surface. The first surface has a middle portion engaging the heat source. A plurality of elongate fins project from the second surface of the base and extend in directions perpendicular to the second surface. Middle ones of the fins are disposed opposite the middle portion of the first surface. Gaps between adjacent middle fins are greater than gaps between adjacent other ones of the fins.

The invention comprises, in yet another form thereof, a heat sink for a heat source. The heat source includes an electronic component. The heat sink includes a base having a first surface and an opposite second surface. The first surface having a middle portion engaging the heat source. A plurality of elongate fins project from the second surface of the base and extend in directions perpendicular to the second surface. Middle ones of the fins have a greater change in width from a proximal end of the fin to a distal end of the fin than do other ones of the fins.

The invention comprises, in still another form thereof, a heat sink for an electronic component. The heat sink includes a base having a convexly shaped surface. A plurality of elongate fins project from the surface of the base and extend in directions perpendicular to the surface. A proximal end of each fin has two opposite sides. Each opposite side is connected to the base by a respective chamfer.

An advantage of the present invention is that it may provide increased heat dissipation when compared to traditional heat sinks both under natural convection conditions and under forced air conditions.

Another advantage of the present invention is that the heat sink may maximize heat dissipation, thus allowing the heat sink envelope to be reduced, and making the heat sink suitable for a head up display (HUD) application in which there are space constraints behind the instrument cluster where the HUD is installed. In contrast, a traditional heat sink has a larger envelope which is costlier due to including more material. Heat pipes used in conjunction with a large remote heat sink are also more expensive. The use of a copper heat sink, heat pipes, or a fan would be costlier and/or increase space requirements.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein.

DETAILED DESCRIPTION

The embodiments hereinafter disclosed are not intended to be exhaustive or limit the invention to the precise forms disclosed in the following description. Rather the embodiments are chosen and described so that others skilled in the art may utilize its teachings.

Figure 1:
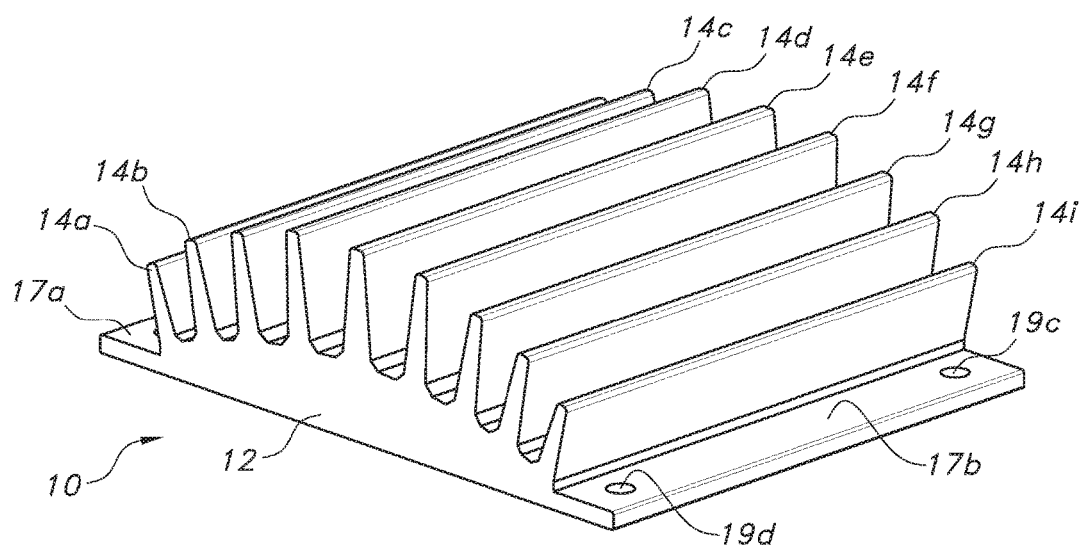
FIG. 1 is a top perspective view of one embodiment of a heat sink of the present invention.
Figure 3:
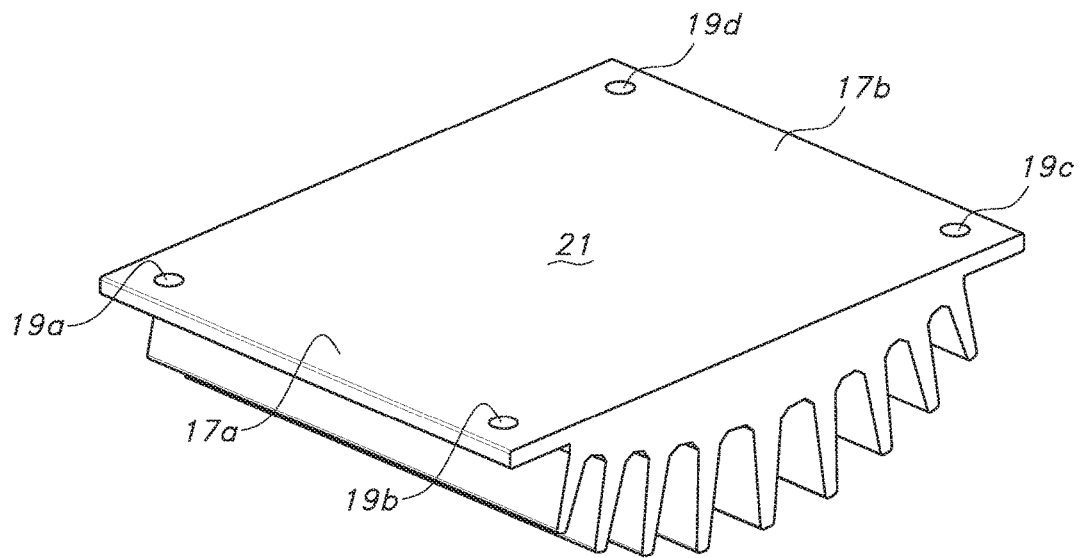
FIG. 3 is a bottom perspective view of the heat sink of FIG. 1.

FIG. 1 is a perspective view of one embodiment of a heat sink 10 of the present invention, including a rectangular base 12 and nine rectangular fins 14a-i extending perpendicularly from base 12. Heat sink 10 may include two elongate flanges 17a-b on opposite sides thereof. Flanges 17a-b may include throughholes, such as throughholes 9a-d, through which heat sink 10 may be secured to a heat generating electronic component. As best shown in FIG. 3, a bottom surface 21 of heat sink 10 may be planar. Heat sink 10 may be formed of extruded aluminum, or some other material that is a good conductor of heat.

Base 12 may have a width 18 (FIG. 4) of approximately between 60 and 80 millimeters, and a length 20 of approximately between 40 and 60 millimeters. A height 22 (FIG. 2) of flanges 17a-b may be approximately between 1.5 and 2.5 millimeters.

A base or root of each of fins 14a-i is sandwiched between two chamfers 24, each of which may have a height of approximately between 0.7 millimeter and one millimeter, and a width of approximately between 0.7 millimeter and one millimeter. A base of fin 14e may have a width 25 of about 3.6 millimeters, or about 5.57 millimeters including chamfers 24; bases of fins 14d and 14f may have a width of about 3.1 millimeters, or about 5.07 millimeters including chamfers 24; bases of fins 14c and 14g may have a width of about 3.0 millimeters, or about 4.87 millimeters including chamfers 24; bases of fins 14b and 14h may have a width of about 3.0 millimeters, or about 4.58 millimeters including chamfers 24; and bases of fins 14a and 14i may have a width of about 2.5 millimeters, or about 3.2 millimeters including chamfers 24.

A distance 28 between fins 14e-f, and between fins 14d-e, not including chamfers 24, may be about 2.37 millimeters; a distance between fins 14f-g, and between fins 14c-d, not including chamfers 24, may be about 1.86 millimeters; a distance between fins 14g-h, and between fins 14b-c, not including chamfers 24, may be about 1.30 millimeters; and a distance between fins 14h-i, and between fins 14a-b, not including chamfers 24, may be about 1.41 millimeters.

A distance 26 between the distal ends of fins 14d-e, and between the distal ends of fins 14e-f, may be about 7.23 millimeters; a distance between the distal ends of fins 14c-d, and between the distal ends of fins 14f-g, may be about 6.38 millimeters; a distance between the distal ends of fins 14b-c, and between the distal ends of fins 14g-h, may be about 5.48 millimeters; and a distance between the distal ends of fins 14a-b, and between the distal ends of fins 14h-i, may be about 5.24 millimeters.

An angle 29 between imaginary lines bisecting fins 14d-e, respectively, and an angle between imaginary lines bisecting fins 14e-f, may both be about five degrees; an angle between imaginary lines bisecting fins 14b-c, respectively, an angle between imaginary lines bisecting fins 14c-d, respectively, an angle between imaginary lines bisecting fins 14f-g, respectively, and an angle between imaginary lines bisecting fins 14g-h, respectively, may each be about four degrees; and an angle between imaginary lines bisecting fins 14a-b, respectively, and an angle between imaginary lines bisecting fins 14h-i, may both be about three degrees.

Heights 31 of fins 14a and 14i may be about eight millimeters; heights of fins 14b and 14h may be about ten millimeters; heights of fins 14c and 14g may be about eleven millimeters; and heights of fins 14d-14f may be about twelve millimeters. It is also possible for fin 14e to be taller than any other one of the fins, such as with a height of about thirteen millimeters. Widths 30 of the distal ends of fins 14a-i may be approximately between 1.2 millimeters and 1.5 millimeters.

Figure 2:
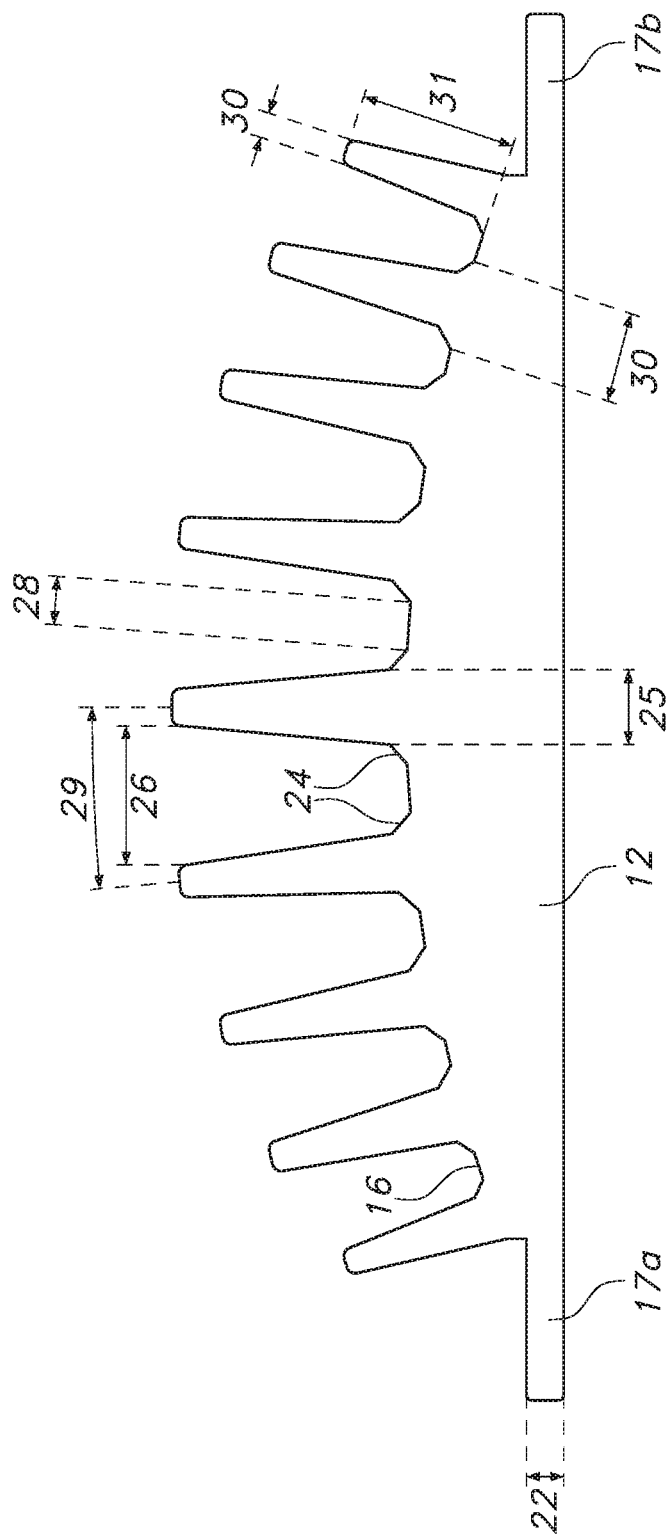
FIG. 2 is a front view of the heat sink of FIG. 1.

As best illustrated in FIG. 2, base 12 has a tapered cross section across its width, thus providing a convex fin mounting surface 16. The thickest portion of base 12 is in the center, and base 12 becomes thinner farther away from the center, providing the highest thermal conduction at the heat source.

Fins 14a-i may be fanned out from each other. More particularly, the distances between adjacent fins may increase towards the upper ends of the fins, resulting in improved convective air flow away from fins 14a-i. The spacing between the middle fin 14e and both of the adjacent fins 14d, 14f may be larger than the spacing between other fins 14 to provide greater convective air flow at the heat source and increased heat dissipation.

Figure 4:
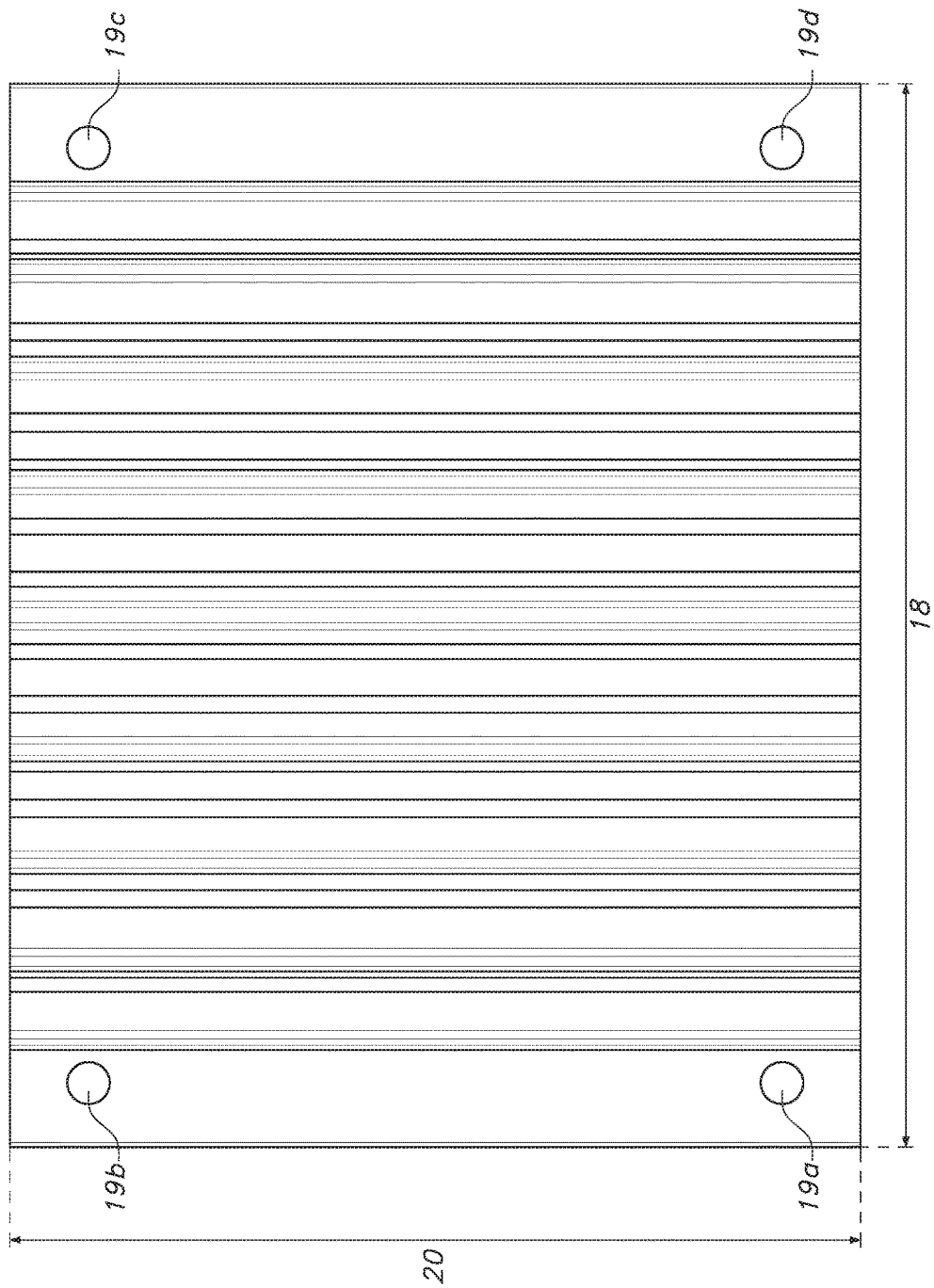
FIG. 4 is a top view of the heat sink of FIG. 1.

A specific embodiment of a heat sink of the present invention is shown in FIGS. 2 and 4 with specific dimensions.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A heat sink for a heat source, the heat source including an electronic component, the heat sink comprising:
   a base having a first surface and an opposite second surface, the first surface having a middle portion configured to engage the heat source; and
   a plurality of elongate fins projecting from the second surface of the base and extending in directions perpendicular to the second surface, middle ones of the fins being disposed opposite the middle portion of the first surface and having a greater height than other ones of the fins, wherein the fins include at least one middlemost fin, and thicknesses of bases of the fins decrease with increasing distance from the at least one middlemost fin.

2. The heat sink of claim 1 wherein the second surface of the base is convexly shaped.

3. The heat sink of claim 1 wherein the fins are increasingly shorter with increasing distance from the at least one middlemost fin.

4. The heat sink of claim 3 wherein angular distances between adjacent said fins decrease with increasing distance from the at least one middlemost fin.

5. A heat sink for a heat source, the heat source including an electronic component, the heat sink comprising:
   a base having a first surface and an opposite second surface, the first surface having a middle portion configured to engage the heat source; and
   a plurality of elongate fins projecting from the second surface of the base and extending in directions perpendicular to the second surface, middle ones of the fins being disposed opposite the middle portion of the first surface, gaps between adjacent said middle fins being greater than gaps between adjacent other ones of the fins.

6. The heat sink of claim 5 wherein the base has a width, the base having a greater thickness at a middle portion along the width than at opposite end portions along the width.

7. The heat sink of claim 5 wherein the fins include at least one middlemost fin, the fins being increasingly shorter with increasing distance from the at least one middlemost fin.

8. The heat sink of claim 7 wherein angular distances between adjacent said fins decrease with increasing distance from the at least one middlemost fin.

9. The heat sink of claim 7 wherein thicknesses of bases of the fins decrease with increasing distance from the at least one middlemost fin.

10. A heat sink for a heat source, the heat source including an electronic component, the heat sink comprising:
    a base having a first surface and an opposite second surface, the first surface having a middle portion configured to engage the heat source; and
    a plurality of elongate fins projecting from the second surface of the base and extending in directions perpendicular to the second surface, middle ones of the fins having a greater change in width from a proximal end of the fin to a distal end of the fin than do other ones of the fins.

11. The heat sink of claim 10 wherein the second surface of the base is convexly shaped.

12. The heat sink of claim 10 wherein the fins include at least one middlemost fin, the fins being increasingly shorter with increasing distance from the at least one middlemost fin.

13. The heat sink of claim 12 wherein angular distances between centerlines of adjacent said fins decrease with increasing distance from the at least one middlemost fin.

14. The heat sink of claim 12 wherein thicknesses of bases of the fins decrease with increasing distance from the at least one middlemost fin.

15. A heat sink for an electronic component, comprising:
    a base having a convexly shaped surface; and
    a plurality of elongate fins projecting from the convexly shaped surface of the base and extending in directions perpendicular to the convexly shaped surface, a proximal end of each said fin having two opposite sides, each said opposite side being connected to the base by a respective chamfer, wherein angular distances between centerlines of adjacent said fins decrease with increasing distance from at least one middlemost one of the fins.

16. The heat sink of claim 15 wherein each said chamfer has an outer surface oriented at an angle of approximately between thirty-five degrees and fifty-five degrees relative to each of the convexly shaped surface of the base and the respective side of the respective fin.

17. The heat sink of claim 15 wherein a height of at least one of the chamfer is more than eight percent of a height of the respective connect fin.

18. The heat sink of claim 15 wherein a width of at least one of the chamfers is more than ten percent of a distance between distal ends of two adjacent said fins, the chamfer being disposed between the two adjacent fins.

* * * * *